(12) United States Patent
Koya

(10) Patent No.: US 6,335,862 B1
(45) Date of Patent: Jan. 1, 2002

(54) MULTILAYER PRINTED WIRING BOARD PROVIDED WITH INJECTION HOLE FOR THERMALLY CONDUCTIVE FILLER

(75) Inventor: Kenji Koya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/710,906

(22) Filed: Nov. 14, 2000

(30) Foreign Application Priority Data

Nov. 17, 1999 (JP) ............................................ 11-326365

(51) Int. Cl.$^7$ ................................................. H05H 7/20
(52) U.S. Cl. ....................... 361/708; 174/252; 174/254; 361/719; 361/720; 361/794
(58) Field of Search ............................... 174/16.3, 252, 174/254, 262–266; 361/704–708, 792, 794, 719–721

(56) References Cited

U.S. PATENT DOCUMENTS

| | | | | |
|---|---|---|---|---|
| 4,396,936 A | * | 8/1983 | Mciver et al. ............... | 361/708 |
| 4,924,352 A | * | 5/1990 | Septfons ..................... | 361/719 |
| 5,390,078 A | * | 2/1995 | Taylor ........................ | 361/721 |
| 5,467,251 A | * | 11/1995 | Katchmar ................... | 361/719 |
| 5,646,826 A | * | 7/1997 | Katchmar ................... | 361/704 |
| 5,796,582 A | * | 8/1998 | Katchmar ................... | 361/704 |
| 6,212,076 B1 | * | 4/2001 | Macquarrie et al. ........ | 361/720 |

FOREIGN PATENT DOCUMENTS

| | | |
|---|---|---|
| JP | 5-160289 | 6/1993 |
| JP | 5-160527 | 6/1993 |
| JP | 5-198696 | 8/1993 |
| JP | 5-326761 | 12/1993 |
| JP | 6-5747 | 1/1994 |
| JP | 10-313071 | 11/1998 |

* cited by examiner

*Primary Examiner*—Gregory Thompson
(74) *Attorney, Agent, or Firm*—Foley & Lardner

(57) ABSTRACT

A multilayer printed wiring board is provided with a thermal conduction path for dissipating heat generated by an integrated circuit into the air. The multilayer printed wiring board includes: an injection hole for injecting a thermally conductive filler; holes for inspecting the filled state of the thermally conductive filler; a heat dissipating planar conductor that dissipates heat of an inner-layer planar conductor into the air; and through holes for thermally connecting the heat dissipating planar conductor to the inner-layer planar conductor. After packaging an integrated circuit, the thermally conductive filler is injected through the injection hole and into a gap between the integrated circuit and the multilayer printed wiring board, and the filled state of the thermally conductive filler is verified by means of the filled state inspection holes. Heat that is generated in the integrated circuit is conducted via the thermally conductive filler to the surface planar conductor, passes by way of the filled state inspection holes, inner-layer planar conductor, through holes, and heat dissipating planar conductor, and is discharged into the air.

7 Claims, 5 Drawing Sheets

MULTILAYER PRINTED WIRING BOARD PROVIDED WITH INJECTION HOLE FOR THERMALLY CONDUCTIVE FILLER

BACKGROUND OF THE INVENTION

1. Field of the Invention

The present invention relates to a multilayer printed wiring board, and more particularly to a multilayer printed wiring board capable of dissipating heat that is generated in integrated circuits into the air.

2. Description of the Related Art

In recent years, improvement in the degree of integration of integrated circuits has been accompanied by improvement in the operating speed, but the heat generated by integrated circuits has also increased. Given these circumstances, a technique for dissipating heat for an integrated circuit mounted on a printed wiring board is disclosed in Japanese Patent Laid-open No. 160527/93.

FIG. 1 shows a plan view of an example in which an integrated circuit is mounted on the above-described printed wiring board of the prior art, and FIG. 2 is a sectional view of FIG. 1 taken along line A–A'. In this example of the prior art, printed wiring board 82 includes: planar conductor 88 provided on surface layer 85, on which integrated circuits 81 are mounted, so as to confront integrated circuit 81; planar conductor 84 provided on rear layer 86 on the opposite side of printed wiring board 82 for dissipating heat; and a plurality of through holes for connecting planar conductor 88 and planar conductor 84. Integrated circuit 81 is mounted on printed wiring board 82, and integrated circuit 81 and printed wiring board 82 are connected together by adhesive 90. Integrated circuit 81 is mounted on multilayer printed wiring board 82 with its terminals 95 fixed and connected to pads 93 by solder 98. Gap 92 between integrated circuit 81 and multilayer printed wiring board 82 is produced by stand-off 96 between terminals 95 and main body 94 of integrated circuit 81. The heat generated by integrated circuit 81 is conducted to planar conductor 88 by way of adhesive 90, further conducted to planar conductor 84 by through holes 83, and is then dissipated by discharging it into the air.

Japanese Patent Laid-open No. 5747/94 also describes a technique by which the heat of an integrated circuit that is mounted on a printed wiring board is conducted by way of a thermally conductive resin to a conductor pattern of inner and outer layers However, the above-described techniques of the prior art suffer from the following disadvantages.

First, in the prior-art example shown in FIG. 1 and FIG. 2, since the planar conductors of the surface layer and rear surface layer are connected by through holes, the planar conductor of the rear surface layer must be positioned on the rear surface corresponding to the position at which the integrated circuit is mounted, thereby imposing limits on the signal wiring of the printed wiring board.

In the prior-art example described in Japanese Patent Laid-open No. 5747/94 the arrangement of an outer-layer conductor pattern has an influence on signal wiring and mounting components around the periphery of the integrated circuit. On the other hand, giving priority to the signal wiring and mounting components around the periphery of the integrated circuit, prevents the arrangement of an adequate conductor pattern.

Furthermore, adequate heat dissipation cannot be achieved because an interlayer insulator, which has low thermal conductivity when dissipating heat into the air, is present between the outer surfaces of the printed wiring board.

SUMMARY OF THE INVENTION

It is therefore an object of the present invention to provide a multilayer printed wiring board in which no limitation is placed on signal wiring of the printed wiring board.

To achieve the aforementioned object, the multilayer printed wiring board according to the present invention comprises: at least one injection hole for injecting a thermally conductive filler between an integrated circuit and a planar conductor; filled-state inspection holes for verifying whether the thermally conductive filler that has been injected from the injection hole has spread over the necessary area; a heat dissipating planar conductor that is arranged on an outer layer that is at a location other than the location at which the integrated circuit is mounted and that is provided for dissipating heat of an inner-layer planar conductor into the air; and through holes for thermally connecting the heat dissipating planar conductor and the inner-layer planar conductor.

Heat that is conducted from an integrated circuit can be conducted to a location other than the position at which the integrated circuit is mounted, by using a planar power supply conductor or a planar ground conductor that is already present in an inner layer of the multilayer printed wiring board, and a heat dissipating planar conductor of the size necessary for dissipating heat into the air can dissipate heat into the air at one position or be divided among a plurality of positions. Accordingly, even in cases in which an integrated circuit generates a great amount of heat, there is no need to provide an unreasonably large planar conductor solely for dissipating heat on the rear surface of the multilayer printed wiring board at the position at which the integrated circuits are mounted, and as a result, any influence on the signal wiring and component mounting in the vicinity of the integrated circuit can be suppressed to a minimum.

In addition, the provision of an injection hole for the thermally conductive filler enables injection of the thermally conductive filler into the gap between the integrated circuit and the multilayer printed wiring board from the rear surface of the multilayer printed wiring board after the integrated circuit has been mounted on the multilayer printed wiring board.

Further, the provision of holes for verifying the filled state of the thermally conductive filler can prevent underfilling or overfilling because it allows verification during injection that the injected thermally conductive filler has spread to the necessary areas.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 1:
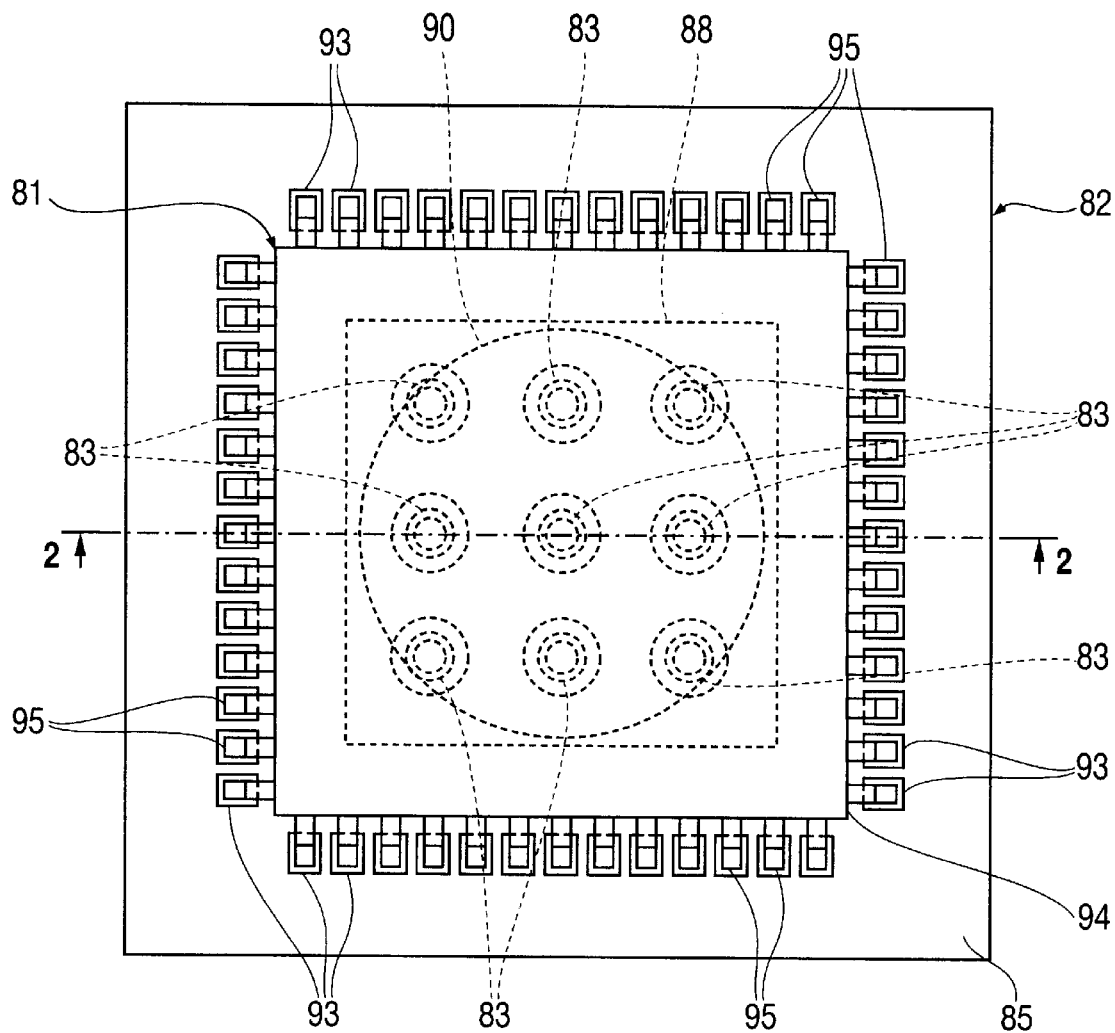
FIG. 1 is a plan view of a prior-art example of a printed wiring board.
Figure 2:
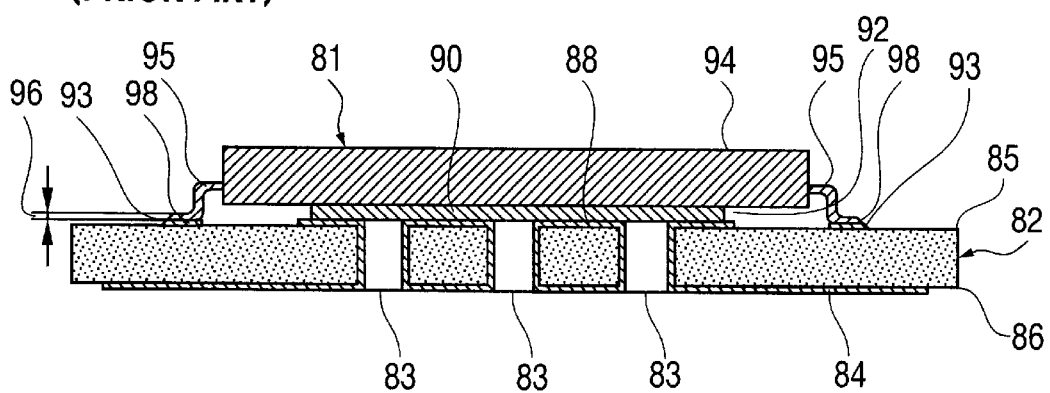
FIG. 2 is a sectional view taken along line A–A' in FIG. 1.
Figure 3:
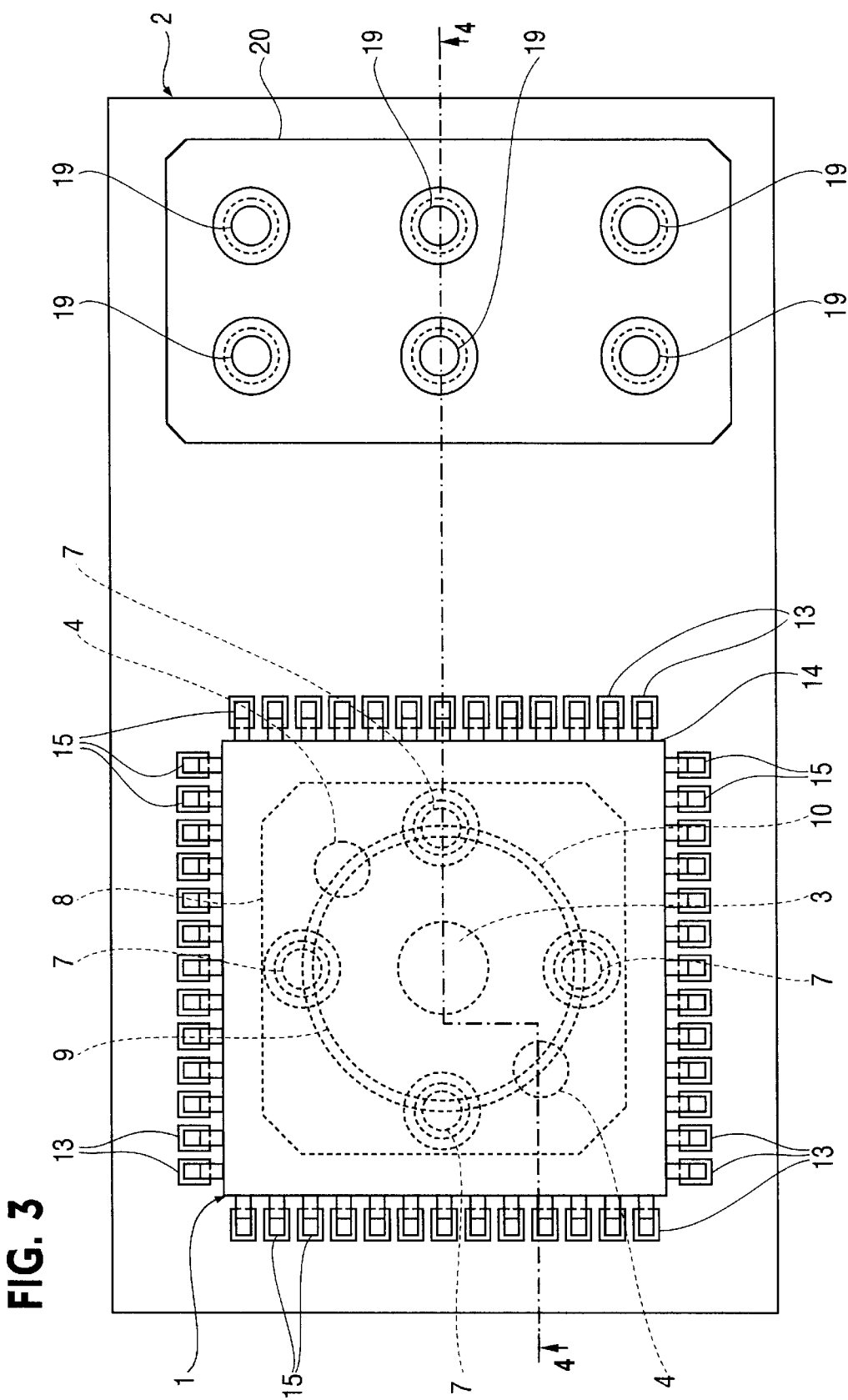
FIG. 3 is a plan view of a printed wiring board according to one embodiment of the present invention.
Figure 4:
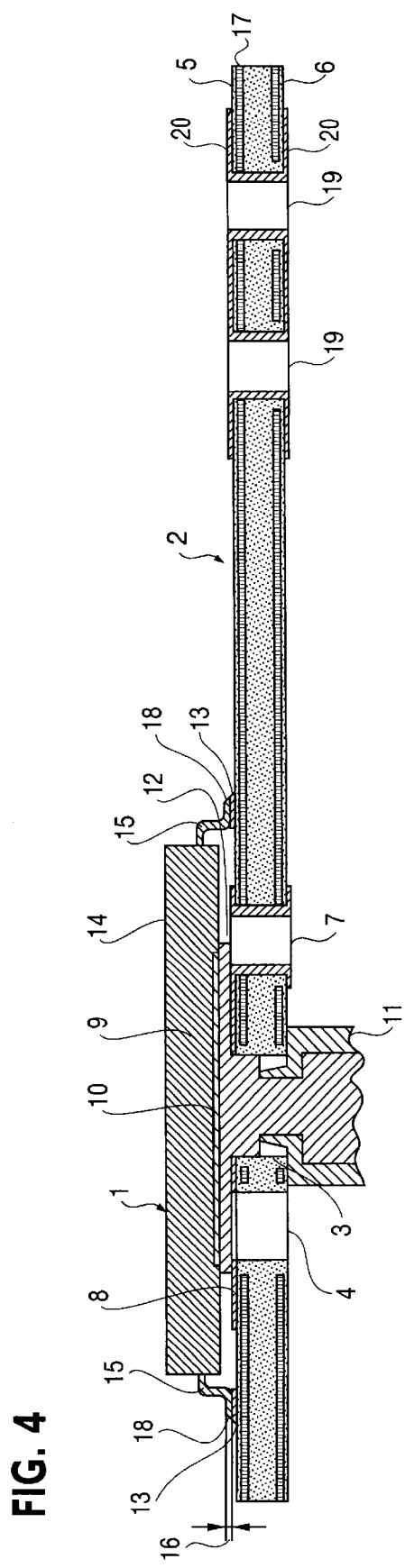
FIG. 4 is a sectional view taken along line B–B' in FIG. 3.

Referring now to FIG. 3 and FIG. 4, there is shown a multilayer printed wiring board 2 according to one embodiment of the present invention which comprises: surface planar conductor 8 provided on surface layer 5 at a position that confronts heat sink 9 of integrated circuit 1; injection hole 3 provided in the central area of surface planar conductor 8; two or more filled-state inspection holes 4 provided evenly or nearly evenly around the periphery of injection hole 3 so as to overlie the outer circumference of the area over which thermally conductive filler 10 must spread; through holes 7 provided at positions within the area of surface planar conductor 8 but not between injection hole 3 and filled-state inspection holes 4; and one or more inner-layer planar conductors 17 provided on an inner layer of multilayer printed wiring board 2. Through holes 7 are formed integrally with surface planar conductor 8 at surface layer 5; and further, are formed integrally with inner-layer planar conductor 17. Inner-layer planar conductor 17 is arranged on an inner layer of multilayer printed wiring board 2 as a ground conductor or power supply conductor and is not arranged solely for the purpose of heat conduction. In addition, a plurality of inner-layer planar conductors 17 may be arranged on an inner layer depending on the multilayer printed wiring board. Through holes 19 are formed integrally with heat dissipating planar conductor 20 and are also connected as a solid unit with inner-layer planar conductor 17.

Next, turning to the method of injecting the thermally conductive filler in the present embodiment, integrated circuit 1 is first mounted and fixed onto multilayer printed wiring board 2 by connecting terminals 15 to pads 13 by solder 18. Gap 12 is formed between mounted integrated circuit 1 and printed wiring board 2 by stand-off 16 between main unit 14 of integrated circuit 1 and terminals 15. The tip of nozzle 11 of an injector such as a syringe is next brought to injection hole 3 from the direction of rear surface layer 6 of multilayer printed wiring board 2 and thermally conductive filler 10 in paste form is injected. A thermally conductive resin paste or a thermo-setting or self-hardening thermally conductive adhesive may be used as thermally conductive filler 10. Thermally conductive filler 10 that is injected from injection hole 3 is squeezed from injection hole 3 into gap 12 and then spreads out. Two or more filled-state inspection holes 4 are arranged in a uniform or nearly uniform positional relation so as to overlie the outer circumference of the area around injection hole 3 over which thermally conductive filler 10 must spread. Thus, it can be determined that thermally conductive filler 10 has spread and filled the necessary area when thermally conductive filler 10 is verified at all of filled-state inspection holes 4, whereupon the injection of thermally conductive filler 10 should be halted.

A heat conduction path is formed by way of thermally conductive filler 10 between heat sink 9 of integrated circuit 1 and surface planar conductor 8 of multilayer printed wiring board 2. In other words, a heat conduction path is formed on multilayer printed wiring board 2 from inner-layer planar conductor 8 to heat dissipating planar conductor 20 by way of through holes 7, inner-layer planar conductor 17, and through holes 19; and a heat conduction path is formed from integrated circuit 1 to heat dissipating planar conductor 20.

As a result, heat generated in integrated circuit 1 is conducted via thermally conductive filler 10 to surface planar conductor 8 provided on surface layer 5 of multilayer printed wiring board 2; conducted by way of through holes 7, which are integral with surface planar conductor 8, to inner-layer planar conductor 17; conducted by way of through holes 19 to heat dissipating planar conductor 20 on surface layer 5 and/or rear surface layer 6; and finally, discharged from heat dissipating planar conductor 20 into the air.

Figure 5:
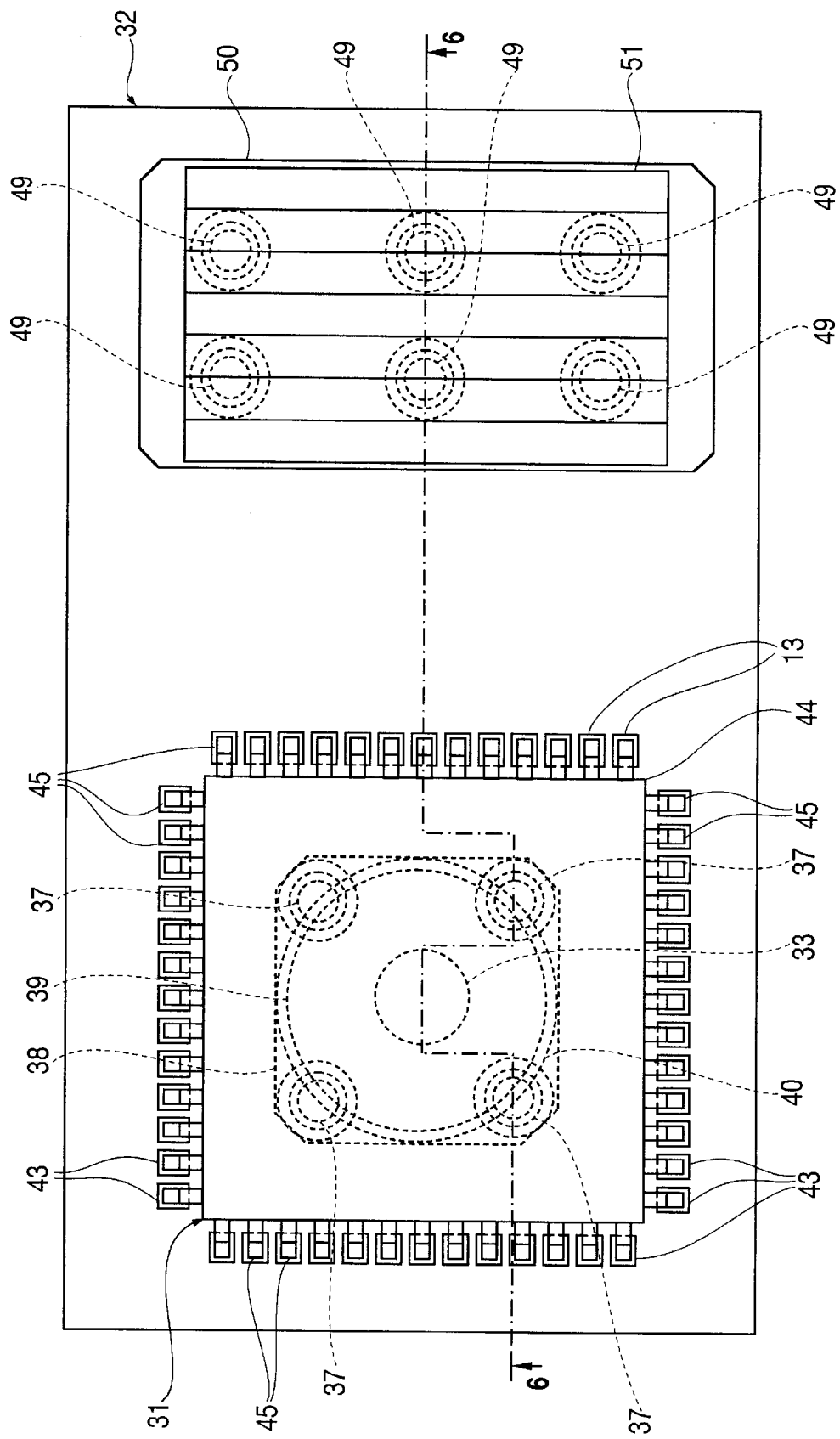
FIG. 5 is a plan view of a printed wiring board according to another embodiment of the present invention.
Figure 6:
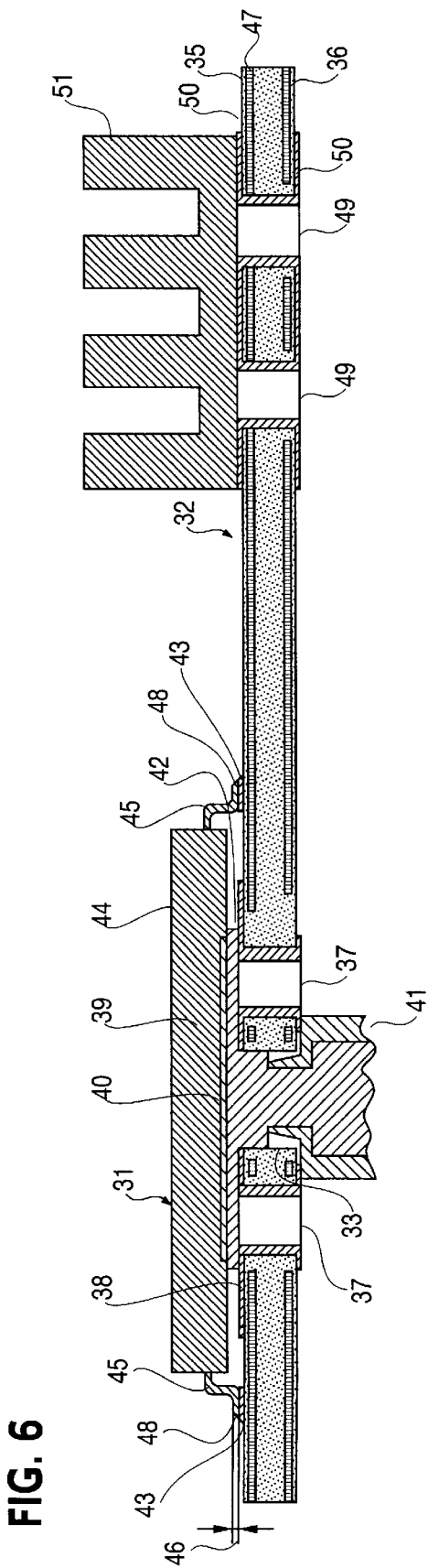
FIG. 6 is a section taken along line C–C' of FIG. 5.

Referring now to FIGS. 5 and 6, there is shown a multilayer printed wiring board 32 according to another embodiment of the present invention, which comprises: surface planar conductor 38 provided on surface layer 35 at a position that confronts heat sink 39 of integrated circuit 31; injection hole 33 provided in the central area of surface planar conductor 38; at least two filled-state inspection through holes 37 provided evenly or nearly evenly so as to overlie the outer circumference of the area over which thermally conductive filler 40 must spread around the periphery of injection hole 3; at least one inner-layer planar conductor 47 provided on an inner layer of multilayer printed wiring board 32; at least one heat dissipating planar conductor 50 provided on surface layer 35 and/or rear surface layer 36 at a position other han the area in which integrated circuit 31 is mounted; and at least one through hole 49 provided inside heat dissipating planar conductor 50. Filled-state inspection through holes 37 are formed integrally with surface planar conductor 38 at surface layer 35, and are also formed integrally with inner-layer planar conductor 47. Inner-layer planar conductor 47 is arranged on an inner layer of multilayer printed wiring board 32 as a ground conductor or power supply conductor, and is not arranged solely for the purpose of heat conductance. In addition, a plurality of inner-layer planar conductors 47 may be arranged on inner layers depending on the multilayer printed wiring board. Through holes 49 are formed integrally with heat dissipating planar conductor 50, and moreover, are also formed as a single unit with inner-layer planar conductor 47. Heat dissipating fins 51 are attached to the area in which heat dissipating planar conductor 50 is arranged.

Turning now to the method of injecting thermally conductive filler 40 in the present embodiment, integrated circuit 31 is placed on and fixed to multilayer printed wiring board 32 by connecting terminals 45 to pads 43 by solder 48. Gap 42 is formed between mounted integrated circuit 31 and multilayer printed wiring board 32 by stand-off 46 between main body 44 of integrated circuit 31 and terminals 45. The tip of nozzle 41 of an injector such as a syringe is brought to injection hole 33 from the direction of rear surface layer 36 of multilayer printed wiring board 32 and thermally conductive filler 40 is injected in a paste state. A heat conductive resin paste or a thermosetting or self-hardening heat conductive adhesive may be used as paste-state thermally conductive filler 40. Thermally conductive filler 40 that is injected from injection hole 33 is squeezed from injection hole 33 and into gap 42 and then spreads out. Two or more filled-state inspection through holes 4 are arranged in a uniform or nearly uniform positional relation so as to overlie the outer circumference of the area around injection hole 33 over which thermally conductive filler 40 must spread. Thus, it can be determined that thermally conductive filler 40 has spread and filled the necessary area when thermally conductive filler 40 is verified at all of filled-state inspection through holes 37, whereupon the injection of thermally conductive filler 40 should be halted.

Accordingly, heat that is generated in integrated circuit 31 is conducted via thermally conductive filler 40 to surface planar conductor 38 provided on surface layer 35 of multilayer printed wiring board 32; is conducted to heat dissipating fins 51 by way of: filled-state inspection through holes 37 that are integral with surface planar conductor 38, inner-layer planar conductor 47, through holes 49, and heat dissipating planar conductor 50, in that order; and finally is dissipated into the air from heat dissipating fins 51. Heat is also dissipated into the air from a heat dissipating planar pattern that is not connected to heat dissipating fins 51.

While preferred embodiments of the present invention have been described using specific terms, such description is for illustrative purposes only, and it is to be understood that changes and variations may be made without departing from the spirit or scope of the following claims.

What is claimed is:

1. A multilayer printed wiring board comprising:

a surface planar conductor provided on a surface confronting a packaged integrated circuit, and an inner-layer planar conductor provided on an inner layer;

first through holes for conducting heat of said surface planar conductor to said inner-layer planar conductor;

at least one injection hole for injecting thermally conductive filler between said integrated circuit and said surface planar conductor;

filled-state inspection holes for verifying whether said thermally conductive filler that is injected from said injection hole has spread over the necessary area;

a heat dissipating planar conductor arranged on an outer layer of said multilayer printed wiring board that is at a location other than the location at which said integrated circuit is mounted and for dissipating heat of said inner-layer planar conductor into the air; and second through holes for thermally connecting said heat dissipating planar conductor and said inner-layer planar conductor.

2. A multilayer printed wiring board according to claim 1, wherein the size of said heat dissipating planar conductor can be freely adjusted according to the amount of heat generated by said integrated circuit.

3. A multilayer printed wiring board according to claim 1, wherein at least two said filled-state inspection holes are provided.

4. A multilayer printed wiring board according to claim 1, wherein said filled-state inspection holes also serve as said first through holes.

5. A multilayer printed wiring board according to claim 1, wherein said first through holes are formed integrally with said surface planar conductor.

6. A multilayer printed wiring board according to claim 1, wherein said inner-layer planar conductor is an inner-layer planar ground conductor or inner-layer planar power supply conductor.

7. A multilayer printed wiring board according to claim 1, wherein heat dissipating fins are attached to said heat dissipating planar conductor.

* * * * *